United States Patent
Villarino-Villa et al.

(10) Patent No.: US 8,625,729 B2
(45) Date of Patent: Jan. 7, 2014

(54) METHOD AND DEVICE FOR CLOCK DATA RECOVERY

(75) Inventors: Ruben Villarino-Villa, Munich (DE); Thomas Kuhwald, Markt Schwaben (DE); Markus Freidhof, Kirchseeon (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 826 days.

(21) Appl. No.: 12/672,482

(22) PCT Filed: Aug. 20, 2008

(86) PCT No.: PCT/EP2008/006849
§ 371 (c)(1),
(2), (4) Date: Feb. 17, 2010

(87) PCT Pub. No.: WO2009/039923
PCT Pub. Date: Apr. 2, 2009

(65) Prior Publication Data
US 2011/0096881 A1    Apr. 28, 2011

(30) Foreign Application Priority Data

Sep. 21, 2007  (DE) .......................... 10 2007 045 085
Apr. 2, 2008   (DE) .......................... 10 2008 016 897

(51) Int. Cl.
*H03D 3/24*    (2006.01)

(52) U.S. Cl.
USPC ........................................ 375/376; 375/355

(58) Field of Classification Search
USPC .................. 375/354, 355, 371–376
See application file for complete search history.

(56) References Cited

U.S. PATENT DOCUMENTS

| 4,532,559 | A  * | 7/1985  | Long et al. ...................... 360/51 |
| 4,771,250 | A    | 9/1988  | Statman et al. .................. 331/17 |
| 5,504,751 | A  * | 4/1996  | Ledzius et al. ................. 341/144 |
| 6,326,851 | B1   | 12/2001 | Staszewski et al. ............. 331/17 |
| 6,809,598 | B1   | 10/2004 | Staszewski et al. ............. 331/16 |
| 7,076,377 | B2 * | 7/2006  | Kim et al. ....................... 702/66 |
| 7,385,539 | B2   | 6/2008  | Vanselow et al. ............. 341/143 |

(Continued)

FOREIGN PATENT DOCUMENTS

| DE | 10 2006 007 022 | 8/2007 |
| EP | 0 312 671       | 4/1989 |

(Continued)

OTHER PUBLICATIONS

Abramovitch, "Phase-Locked Loops: A Control Centric Tutorial," Proceedings of the American Control Conference, pp. 1-15 (2002).

*Primary Examiner* — Chieh M Fan
*Assistant Examiner* — Freshteh N Aghdam
(74) *Attorney, Agent, or Firm* — Marshall, Gerstein & Borun LLP

(57) ABSTRACT

A method for the recovery of a clock signal from a data signal, wherein the edges of the data signal and the clock signal are each presented by an ordered sequence of timing points, comprising determining missing edges in the sequence of data-signal edges, inserting new data-signal edges ($D_x$) into the sequence of data-signal edges to obtain a completed sequence of data-signal edges, and recovering the clock signal from the completed sequence of data-signal edges. The detection of missing edges in the sequence of data-signal edges is based on a prediction of the clock signal (FRONT CLOCK).

11 Claims, 7 Drawing Sheets

(56) References Cited

U.S. PATENT DOCUMENTS

| | | | |
|---|---|---|---|
| 7,817,767 B2 * | 10/2010 | Tell et al. | 375/376 |
| 2002/0094052 A1 | 7/2002 | Staszewski et al. | 375/376 |
| 2004/0071247 A1 * | 4/2004 | Dunning et al. | 375/355 |
| 2004/0085579 A1 | 5/2004 | Campbell et al. | 358/1.18 |
| 2006/0140321 A1 * | 6/2006 | Tell et al. | 375/376 |
| 2006/0262613 A1 * | 11/2006 | Braun et al. | 365/193 |

FOREIGN PATENT DOCUMENTS

| | | |
|---|---|---|
| EP | 1 076 416 | 2/2001 |
| GB | 2 359 223 | 8/2001 |
| JP | 07058790 | 3/1995 |

* cited by examiner

METHOD AND DEVICE FOR CLOCK DATA RECOVERY

BACKGROUND OF THE INVENTION

1. Field of the Invention

The invention relates to a method for clock data recovery and an associated device

2. Technical Background and Prior Art

In digital transmission technology, many binary data streams, especially serial data streams with a high bit rate, are transmitted without accompanying clock signal. The goal of clock data recovery (clock data recovery, CDR) is to determine from the received data stream the frequency and phase of the underlying transmission clock pulse.

In a conventional receiver, the recovered transmission clock-pulse signal or clock signal is used for decoding the transmitted bit sequence, wherein the received signal pulse is sampled exactly in the center in order to maximize the signal-noise ratio. In signal analysis, the recovered clock signal is used for the evaluation of the signal quality on the basis of so-called eye diagrams (eye diagram) and other mathematical tools for jitter analysis.

The transmission clock pulse is often determined by means of a PLL (phase-locked loop), a phase-locked control circuit. Various standards prescribe a standardized receiver for signal-quality analysis in the form of PLL properties. The recovered clock signal in this context determines the ideal bit start time according to definition. The evaluation of deviations between the zero passes in the received data stream and in the clock signal forms the basis for the jitter analysis.

The transmission clock pulse is, in principle, recovered in two different ways for the signal analysis or respectively jitter analysis:

The PLL is realized in hardware through the use of components. The user feeds the time-continuous data stream into the PLL and obtains a time-continuous clock signal and the data stream delayed by the processing latency. The data stream and clock signal are synchronised with one another. The method operates online in real time; the data stream is observed constantly.

The PLL is modelled in software with an arithmetic specification. A measuring device takes up a portion of the data stream and applies the clock data recovery algorithm. The clock signal for the recorded data portion is recovered from this. The method generally operates offline, because the processing time of the algorithm is longer than the time duration of the recorded data portion.

Hardware PLLs known from the prior art can be subdivided into three categories: linear PLLs, digital PLLs and all-digital PLLs (all-digital PLL). All three types of PLL process and generate analog, time-continuous signals, wherein the digital and all-digital PLLs are adapted for the processing of binary, serial data streams.

The term "software PLL" generally denotes the arithmetic specification, which models the functioning of a hardware PLL. One approach is to describe the operation of the analog components mathematically and accordingly to process a highly sampled version of the received data stream. A second approach is based on the observation that only the zero passes in the data stream contain the relevant information for the clock data recovery. In this case, the position of the zero passes is initially determined by interpolation of the stored data portion and from this, the zero passes of the clock signal are then calculated.

FIG. 1 shows the simplified structure of a PLL according to the prior art. The input signal $x_0(k)$ is a list with the time position of the zero passes in the data stream, also referred to below as data edges. The calculated clock edges are referred to as $y(k)$. The PLL generates only one clock edge per bit period. If the underlying, time-continuous clock signal is imagined as a sinusoidal oscillation, then $y(k)$ denotes the timing points with phase equal to 0.

The $x_0(k)$ are chronologically ordered and processed sequentially. Initially, the time difference $e(k)$ between data edges and clock edges is formed in the phase detector. Since no signal throughput takes place when the transmitter transmits two or more identical bits in succession, the number of data edges is generally smaller than the number of transmitting bits.

The software PLL recovers the underlying clock pulse in the form of a sequence of clock edges $y(k)$. The processing steps are, for example:

Phase or timing error: $e(k)=x_0(k)-y(k)$

Handling of missing edges: a) If $|e(k)|<T_0/2$ set $e(k)=0$ and reject $x_0(k)$;
  b) If $|e(k)|>T_0/2$, set $e(k)=0$ and retain $x_0(k)$ for the next iteration.

Filtered errors: $d(k)=F(q^{-1})\cdot e(k)$

Momentary bit-period estimate: $T_b(k)=T_0+d(k)$

Next clock edge: $y(k+1)=q\cdot A(q^{-1})\cdot T_b(k)$

With a targeted selection of the coefficients of $F(q^1)$ and $A(q^{-1})$, this software PLL can approximate the theoretical PLL transmission function very well provided it operates offline. In the case of a realization operating in real time, it should be borne in mind, that each of the above processing steps requires a certain processing time. The total realization-determined delay falsifies the transmission function of the phase-locked loop and can even endanger stability. As a rule of thumb, a real-time-capable software PLL according to the prior art can only be used for the analysis of data streams, of which the bit period $T_b$ is greater than the processing time for calculating a new clock edge $T_{MIN}$.

SUMMARY OF THE INVENTION

The invention provides a method and a device for clock data recovery, which determines the clock edge positions by processing data edges and with which the minimal analysable bit period is as small as possible.

Accordingly, the invention provides a method for the recovery of a clock signal from a data signal, wherein the edges of the data signal and of the clock signal are each presented by an ordered sequence of timing points, comprising the steps: determination of missing edges in the sequence of data-signal edges; insertion of new data-signal edges into the sequence of data signal edges, in order to obtain a completed sequence of data-signal edges; recovery of the clock signal from the completed sequence of data-signal edges, characterized in that the detection of missing edges in the sequence of data-signal edges is based upon a prediction of the clock signal (FRONT CLOCK).

The invention also provides a machine-readable data medium, which stores instructions, which, when executed by a computer, implements the inventive method.

The invention further provides a system for the recovery of a clock signal from a data signal, wherein the edges of the data signal and the clock signal are each presented by an ordered sequence of timing points, comprising means for determining missing edges in the sequence of data-signal edges, means for inserting new data-signal edges into the sequence of data-signal edges to obtain a completed sequence of data-signal edges, and means for recovering the clock signal from the completed sequence of data-signal edges, wherein the means for detecting the missing edges in the sequence of data-signal edges further comprises means predicting the clock signal (FRONT CLOCK), upon which the detection is based.

A method for the recovery of a clock signal from a data signal, wherein the edges of the data signal and the clock signal are each presented by an ordered sequence of timing points, comprises the steps:
  determination of missing edges in the sequence of data-signal edges;
  insertion of new data-signal edges into the sequence of data-signal edges, in order to obtain a completed sequence of data-signal edges; and
  recovery of the clock signal from the completed sequence of data-signal edges.

According to the invention, the detection of missing edges in the sequence of data-signal edges is based on a prediction of the clock signal (FRONT CLOCK).

In other words, the phase-locked loop from FIG. 1 is converted in such a manner that the missing edges are detected and filled outside the actual phase-locked loop and the PLL core accordingly consists only of the loop filter $F(q^{-1})$, the accumulator $A(q^{-1})$, the adder for determining the phase error e(k) and $T_0$. This processing of signals with missing edges is based on a predictive assignment of the clock edges and data edges. Missing edges, which occur because of the transmission of several identical bits in succession can be detected and handled separately, for example, by interpolation.

Relocating the handling of missing edges outside the phase-locked loop according to the invention achieves a simplification of the phase-locked loop by reducing the operational steps in the phase-locked loop. Accordingly, the minimal analysable bit period $T_{MIN}$ can be reduced. Moreover, it is possible to convert the simplified phase-locked loop into an equivalent structure for parallel processing of several successive data edges (block filtering), which increases the throughput of the software PLL by a considerable factor.

In fact, the relocated handling of missing edges introduces an additional error component into the system. However, the smaller the prediction depth, the PLL bandwidth and the ratio of missing edges to transmitted bits, the better the proposed clock data recovery method will approximate the behaviour of the original software PLL from FIG. 1.

Advantageous exemplary embodiments are outlined in the following sections.

DETAILED DESCRIPTION OF THE INVENTION

Figure 1:
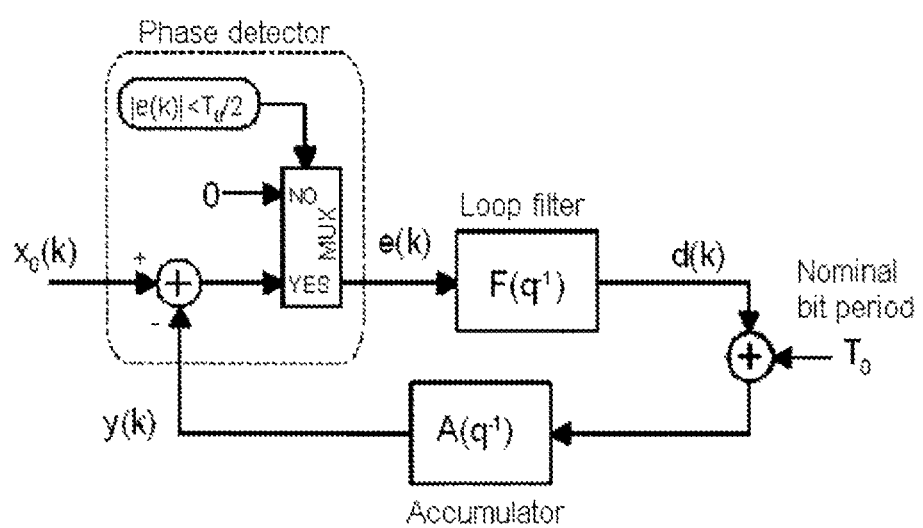
FIG. 1 shows a block-circuit diagram of a data-edge processing software PLL according to the prior art.
Figure 2:
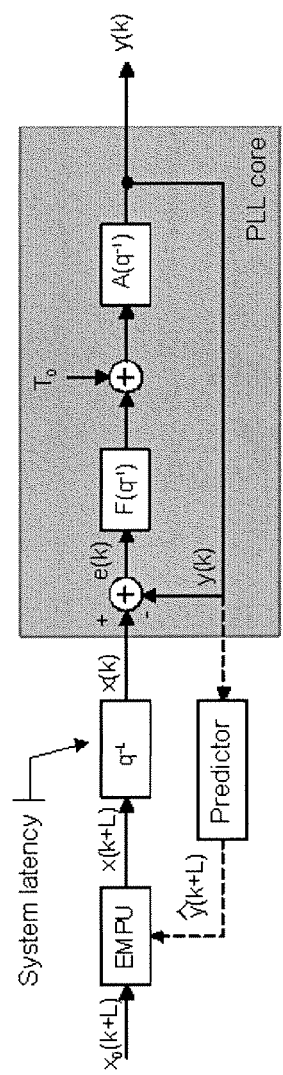
FIG. 2 shows a block-circuit diagram of a software PLL according to a first embodiment of the invention.

FIG. 2 shows a block circuit diagram of a first embodiment of the invention. According to the invention, a predictive assignment of clock edges and data edges and a determination of missing edges is initially implemented in the block marked with EMPU (edge matching and patching unit). For this task, the EMPU uses a prediction of the clock edges $\hat{y}(k+L)$. The prediction is required because the duration of the processing in the EMPU and in the PLL core introduces in total system latency of L data edges. Using $\hat{y}(k+L)$, the EMPU determines an interpolated, gap-free data edge sequence x(k+L) from the coarse data edge sequence $x_0(k+L)$, which generally provides several missing edges.

This sequence of data edges x(k) is then processed in the main control loop of the PLL, also referred to below as the PLL core, in order to determine the clock edges y(k). The PLL core comprises a loop filter F(e), an accumulator $A(q^{-1})$, an adder for determining the phase error e(k) and the contribution of the nominal bit period $T_0$.

The dotted line indicates that the EMPU is coupled to the PLL core, for example, via the recovered clock edges y(k).

The following section explains the functioning and favourable embodiments of the EMPU.

Figure 3:
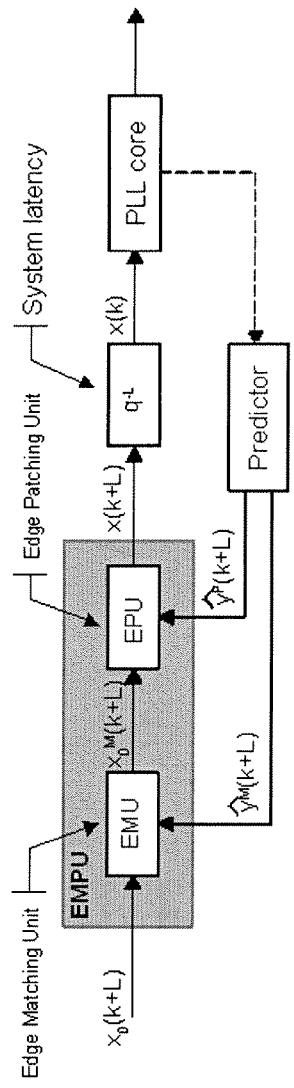
FIG. 3 shows a block-circuit diagram of a software PLL according to a second embodiment of the invention.

FIG. 3 shows a block circuit diagram of a software PLL according to a second embodiment of the invention. The EMPU can be subdivided into a block referred to as the EMU (edge matching unit) for the assignment of data edges and clock edges and a block referred to as the EPU (edge patching unit) for filling the missing edges.

In the edge matching unit (EMU), the incoming data edges are initially assigned to a given bit period, and accordingly the missing edges are detected. The EMU uses the clock edge prediction $\hat{y}^M(k+L)$ in order to insert placeholders into the data edge sequence $x_0(k+L)$ in the case of the missing edges. Following this, the missing-edge placeholders are replaced in the edge patching unit (EPU) by an appropriate value. This results in the interpolated, gap-free data edge sequence x(k+L).

A predictor supplies two edge sequences. The EMU can use a clock edge prediction $\hat{y}^M(k+L)$ to subdivide the time axis into mutually adjacent intervals of the width of one bit period and accordingly to implement an assignment of the data edge positions to the intervals. The EPU can use the sequence $\hat{y}^P(k+L)$ for the interpolation of the data edges, in order to bring about a desired behaviour of the phase error e(k) in the PLL core in the case of missing edges. Dependent upon the application, the sequences can be identical.

One possible functioning of the EMU will be presented in greater detail in the following section.

Edge Assignment

Figure 4:
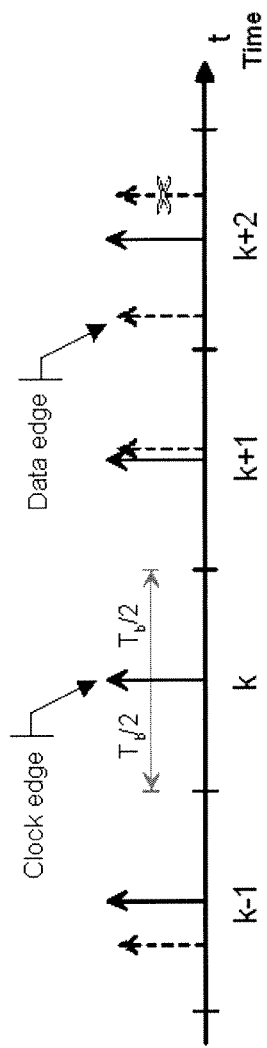
FIG. 4 shows the pairing of data edges and clock edges (edge assignment)

FIG. 4 shows, with reference to an example, the basic problem in the assignment of data edges and clock edges. The data edges $x_0(k)$ and clock edges y(k) are each entered on the time axis with dotted arrows and continuous arrows. The recovered clock edges represent the anticipated position of the noise-free data edges according to definition and are taken as a reference point for the edge assignment. Starting from the clock edges, the time axis is subdivided into mutually adjacent intervals. By way of simplification, it should be imagined that every clock edge is disposed in the center of an interval of the length of one bit period $T_b$.

In theory, it is possible to distinguish three cases:
  1. If a single data edge is disposed within a given interval, it can be unambiguously assigned to the corresponding clock edge (indices 'k−1' and 'K+1' in FIG. 3).
  2. If no data edge is disposed within an interval, a so-called 'missing edge' (English: missing edge) may be present (index 'k'). Missing edges occur in the case of a transmission of the sequences " . . . 00 . . . " or " . . . 11 . . . ", because no signal interface occurs between the two bits. Missing edges can be marked and handled separately.

3. Several data edges in the same interval can indicate glitches in the signal, a low SNR or a still-unsettled PLL. In this case, one data edge can be retained and the others can be rejected (index 'k+1'). As an alternative, all edges can be rejected because basically all are equally false.

Conventional software or hardware PLLs operate in a basically sequential manner and determine the clock edge y(k+1) by processing earlier data edges and clock edges up to the time index k. However, for the edge assignment according to the invention, a prediction ŷ(k) of the clock edges y(k) is required, because the clock edge y(k) is not yet available at this time.

For this purpose, the EMU defines a secondary clock signal, referred to below as 'front clock'. The front clock $\hat{y}^M(k)$ represents a prediction of the recovered clock edges y(k) and is used in the subdivision of the time axis for the edge assignment. In one embodiment of the invention, the front clock can be coupled with the PLL core and therefore with the recovered clock edges y(k), as indicated by the dotted line in the block-circuit diagrams of FIG. 3.

In one possible embodiment, the front clock estimates the future clock edges y(k) according to the approach "the PLL clock will continue for the next N bit periods with the nominal bit period $T_0$". This approach for determining the front clock $\hat{y}^M(k)$ is favourable for implementation purposes, because $T_0$ is a known operating parameter, but presupposes small prediction depths L and a slight deviation of the momentary bit periods $\hat{T}_b$ from the nominal value $T_0$. The non-fulfillment of the prediction assumption leads to a phase offset between the clock edges y(k) and the front clock. After the settling of the PLL on the data stream with constant bit period $T_0$, the phase offset can be approximated as follows:

$$\varphi = \frac{T_b - T_0}{T_b} \cdot L \qquad (1)$$

[UI] (Unit Interval)

wherein
$T_b$: denotes the bit period of the data stream
$T_0$: denotes the nominal bit period
L: denotes the prediction depth or respectively processing latency measured in number of periods.

If the front clock is used instead of the PLL clock for the edge assignment, the phase offset causes a displacement in the underlying time intervals relative to their ideal position. In the case illustrated in FIG. 4, the data edge is disposed so unfavourably, that the EMU assigns it erroneously on the basis of the phase offset to the k-th interval. An excessively large phase offset can noticeably impair the settling properties and jitter robustness of the clock recovery.

An improved performance is generally obtained if the front clock is determined according to the approach "the PLL clock will continue for the next N bit periods with the last-estimated momentary bit period $\hat{T}_b$". This approach exploits the fact that the PLL reacts slowly to changes in the input signal because of its narrow band width. Accordingly, after settling on a data stream of constant bit period $T_b$ according to (1), the phase offset is now approximately φ=0. Other prediction approaches are conceivable.

Data Edges in a Time Window

Within a system operating online, the data stream is observed constantly. The clock data recovery is presented with a set of new data edges regularly, for example, every system clock pulse, via an external auxiliary device. The system clock pulse defines a given window on the time axis. The data edges must be assigned to one of the clock edges disposed within the window. If the bit period of the data stream is smaller than the time window or respectively the system clock pulse, this can be handled with an edge assignment implemented in parallel.

Against this background, the functioning of the EMU can be subdivided into two sub-tasks. Initially, the clock edges covered by the current system clock pulse or respectively current time window are determined using the front clock. Following this, the received data edges are paired with the clock edges and accordingly the missing edges are also determined.

Figure 5:
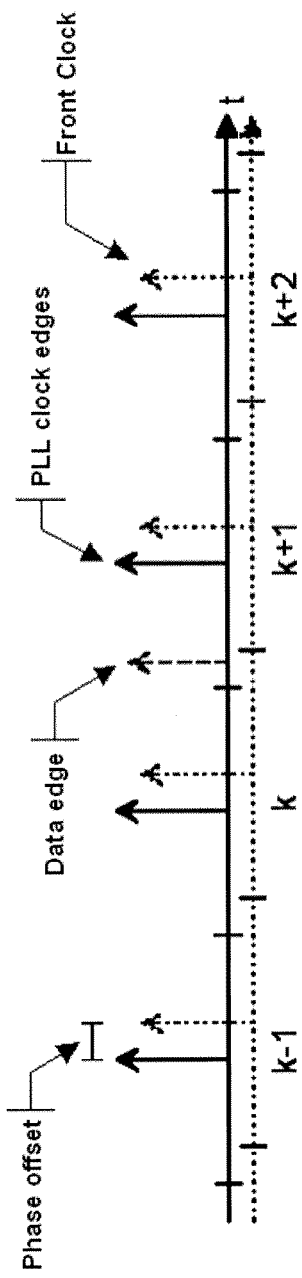
FIG. 5 shows the phase offset in the edge assignment;
  Phase 6 shows the determination of the effective number of clock edges.

FIG. 5 shows by way of example data edges and clock edges, which are each disposed on the time axis, as dotted and continuous arrows. The time window defined by the current system clock pulse is marked with a grey background. The following applies:

The k-th and (k+1)-th intervals fit completely into the m-th time window. The unambiguous assignment of clock edges and data edges is possible.

The part of the (k−1)-th interval, which has not yet been observed in the (m−1)-th time window, is covered by the current time window. After the (k−1)-th interval has been completely scanned, an unambiguous edge assignment is also possible here.

The (k+2)-th interval is only partially covered and cannot be released for the edge assignment. The data edge already disposed within the interval is stored and evaluated in the next system clock pulse.

The front clock specifies the position of the clock edges $t_F(k)$. In order to determine the time intervals covered by the current time window, it is helpful to compare the upper limit of the k-th interval $t_F^+(k)$, which is derived from the clock edges, for example, according to $t_F^+(k)=t_F(k)+T_0/2$, with the upper limits of the m-th time window $t_S^+(m)$. With reference to FIG. 5, the following applies:

$t_F^+(k-1)$ has already been calculated in the evaluation of the (m−1)-th time window and is known.

$t_F^+(k-1)$, $t_F^+(k)$ and $t_F^+(k+1)$ are all smaller than t(m). The corresponding intervals are released for the edge assignment. The number of processed clock edges is three.

$t_F^+(k+2)$ is larger than $t_S^+(m)$. Both $t_F^+(k+2)$ and also the received data edges are stored until the next system clock pulse.

In summary, the effective number of clock edges in the m-th time window is determined with regard to how many $t_F^+(k)$ fit between the timing points $t_S^+(m-1)$ and $t_S^+(m)$.

Figure 6:
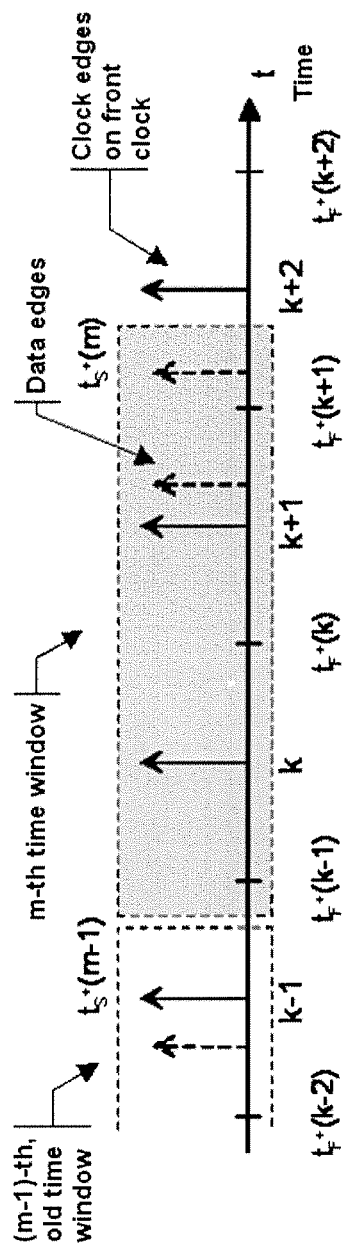
Figure 7:
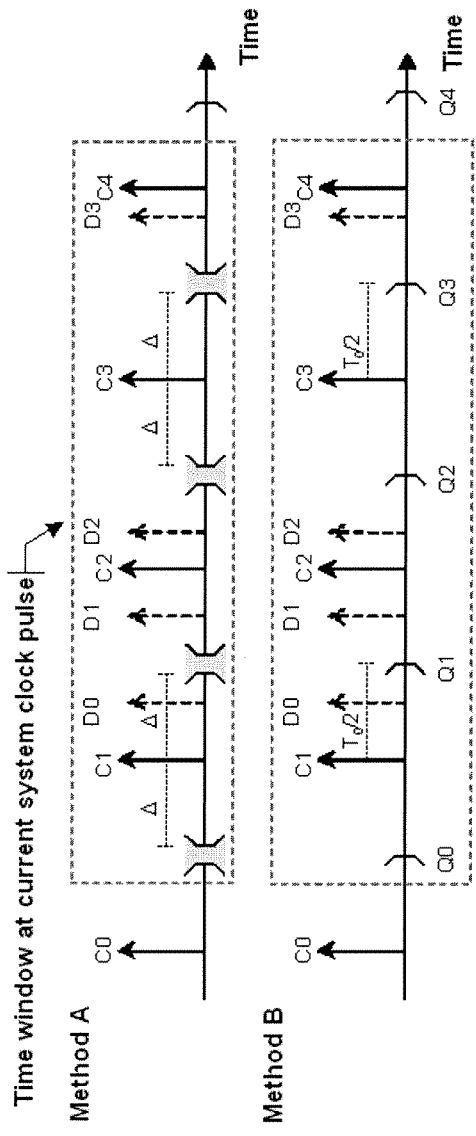
FIG. 7 shows two methods for edge assignment.

FIG. 6 illustrates two possible methods for the assignment of data edges and clock edges. Four data edges, D0 to D3 are contained in the time window. The effective number of clock edges is also four: C0, C1, C2 and C3. C4 is not processed, because its upper time limit $t_F^+(4)$ is disposed outside the time window.

Method A combines data edges with clock edges according to the rule:

$$\text{If } |D_a - C_b| \leq \Delta, \text{then } D_a \text{ and } C_b \text{ fit together}(a, b \geq 0), \qquad (2)$$

wherein D is selected so that the time axis is subdivided into non-overlapping intervals. Data edges, which occur in the regions not covered by the intervals are simply ignored. According to FIG. 6, the following applies:

C0 and C3 remain without a partner and are marked as missing edges.

C1 is linked with D0.

D1 and D2 should be assigned to C2. A maximum of one data edge per clock edge is permitted, and accordingly, one of the two is selected. The occurrence of a data-edge collision is reported if required.

The edge assignment can be described formally in the form of a matrix by the following table:

TABLE 1 assignment to matrix for Method A.

| $|D_a - C_b| \leq \Delta$ | C0 | C1 | C2 | C3 |
|---|---|---|---|---|
| D0 | 0 | 1 | 0 | 0 |
| D1 | 0 | 0 | 1 | 0 |
| D2 | 0 | 0 | 1 | 0 |
| D3 | 0 | 0 | 0 | 0 |

The clock edges and data edges are sorted in each case in chronological order. On the assumption that a maximum of one data edge occurs per bit period, the calculation of the elements in the lower, shaded triangular matrix can be skipped in order to lower the computational cost and are set to 0 as a default. However, this reduces the robustness of the assignment matrix if several data edges per bit period occur, as can be the case, for example, during the settling of the PLL. Embodiments of the invention are also possible, in which only the calculation of the elements of the lowest diagonals are skipped.

Method B presents an alternative embodiment of the same approach. Here, the time axis is subdivided via the timing points $Q_b$ into mutually adjacent intervals. The $Q_b$ correspond to the timing points $t_F^+(k)$, which are calculated in order to determine the effective clock edge number. Data edges and clock edges are now linked to one another according to the following rule:

If $Q_{b-1} < D_a \leq Q_b$, then $D_a$ and $C_b$ fit together ($a,b \geq 0$)  (3).

Accordingly, in the example under consideration, the same assignment matrix is obtained as with Method A. Missing edges are assumed, if rule (3) does not apply.

Interpolation of the Missing Edges

The missing edges detected according to one of the two methods are handled separately. According to the invention, the EMPU interpolates $x_0(k)$ and generates an gap-free data-edge sequence $x(k)$, which is then processed by the PLL core. The interpolation is implemented, for example, by filling the missing edges with an artificial edge. In this context, the phase error $e(k)$ can be influenced by setting the interpolated data edges in an appropriate manner such that the methods for the treatment of missing edges used in the conventional PLL according to the prior art are approximated.

In the embodiment presented with reference to FIG. 3, the EPU can use the sequence $\hat{y}^P(k+L)$, in order to bring about a desired behaviour of the phase error $e(k)$ in the PLL core in the case of missing edges. For example, in one embodiment of the invention, a missing edge can be filled with a prediction of the clock edge. Accordingly, the following applies in the PLL core:

$$e(k) = \hat{y}^P(k) - y(k) \approx 0$$

Other approaches such as $e(k) = e(k-1)$ can be realized through an appropriate selection of the edges to be interpolated. For example, if $x_0^M(k+L-1)$ is a data edge and $x_0^M(k+L)$ contains a missing edge, the following approach can be applied:

$$x(k+L-1) = x_0^M(k+L-1)$$

$$x(k+L) = \hat{y}^P(k+L) = x(k+L-1) + \hat{T}_b(k)$$

In this context, it must be remembered that for the determination of $x(k+L)$, only the estimation of the bit period $\hat{T}_b(k)$ delayed by L bit periods is available in view of the system latency. Accordingly, if a newly inserted data-signal edge corresponds to the sum of the data edge last calculated and the bit period $\hat{T}_b(k)$ last estimated, the phase error $e(k)$ is calculated as follows in the PLL core:

$$e(k-1) = y(k-1) - x(k-1)$$

$$\begin{aligned} e(k) &= y(k) - x(k) \\ &= y(k-1) + T_b(k) - \left(x(k-1) + \hat{T}_b(k)\right) \\ &= e(k-1) + \left(T_b(k) - \hat{T}_b(k-L)\right) \\ &\approx e(k-1) \end{aligned}$$

That is to say, an approximation of an edge error $e(k)$ according to equation $e(k) = e(k-1)$ can be achieved, taking into consideration the latency of the overall system and provided that the momentary bit period only changes slowly within the system latency, by forming the sum of the preceding data edge and the estimate of the bit period delayed by the latency L, in order to calculate the data edge, with which a missing edge is filled.

As an alternative, instead of the last-estimated bit period $\hat{T}_b(k)$, the nominal bit period $T_0$ can also be added to the last calculated data edge. However, in this context, the accumulation of bit-period deviations $\hat{\Delta}(k) = \hat{T}_b(k) - \hat{T}_0$ must be considered in the case of an occurrence of several missing edges in succession. In other words, the approximation error is accumulated over the number of successive missing edges and, after N identical bits, amounts to approximately $N(T_b - T_0)$. The transmission standards define an upper limit for the number of equivalent successive bits, and accordingly, N is small in practice. The accumulated error is automatically reset with every data edge to $x_0^M(k)$.

In summary, by an appropriate selection of $\hat{y}^P(k+L)$, the phase-error behaviour $$e(k) = f(e(k-1), e(k-2), e(k-3), \ldots)$$

can therefore be modelled or at least approximated, wherein $f(.)$ can be an arbitrary function of earlier phase-error values.

Although the filling of the missing edges takes place in the EPU, for the purpose of explanation, this can be realized dependent upon the implementation at one or more positions in the processing path between missing-edge assignment and PLL core.

The invention is not restricted to the exemplary embodiment presented. All of the features described and/or illustrated can be combined with one another within the framework of the invention.

The invention claimed is:

1. A method for recovery of a clock signal from a data signal, wherein edges of the data signal and of the clock signal are each presented by an ordered sequence of timing points, comprising the steps:
   determining missing edges in the sequence of data-signal edges;
   inserting new data-signal edges into the sequence of data-signal edges to obtain a completed sequence of data-signal edges; and, recovering the clock signal from the completed sequence of data-signal edges, wherein determining the missing edges in the sequence of data-signal edges is based upon predicting a next clock signal, and inserting the new data signal edges into the sequence of data-signal edges based on predicting the next clock signal.

2. The method according to claim 1, wherein determining the missing edges comprises detecting a missing edge, if no data-signal edge ($D_x$) exists for a predicted clock-signal edge ($C_y$), so that $$|D_x - C_y| \leq \Delta x, y \geq 0,$$

wherein $\Delta$ is selected in such a manner that a time axis is subdivided into non-overlapping intervals.

3. The method according to claim 1, comprising determining the missing edges includes detecting a missing edge, if no data-signal edge ($D_x$) exists, so that $$Q_{y-1} < D_x \leq Q_y, x, y \geq 0$$

wherein the timing points $Q_y$ subdivide a time axis into mutually adjacent intervals.

4. The method according to claim 3, wherein each of the new data-signal edges is substantially identical to a momentary prediction of the clock signal.

5. The method according to claim 3, wherein each of the new data-signal edges is substantially identical to the sum of the last data-signal edge and a momentarily estimated bit period.

6. The method according to any claim 3, wherein each of the new data-signal edges is substantially identical to the sum of the last data-signal edge and a nominal bit period ($T_0$).

7. The method according to claim 2, wherein each of the new data-signal edges is substantially identical to a momentary prediction of the clock signal.

8. The method according to claim 2, wherein each of the new data-signal edges is substantially identical to the sum of the last data-signal edge and a momentarily estimated bit period.

9. The method according to claim 2, wherein each of the new data-signal edges is substantially identical to the sum of the last data-signal edge and a nominal bit period ($T_0$).

10. A non-transitory computer-readable medium having computer-executable instructions stored in the non-transitory computer-readable medium and adapted to be executed by a computer to implement the method according to claim 1.

11. A system for recovery of a clock signal from a data signal, wherein edges of the data signal and edges of the clock signal are each presented by an ordered sequence of timing points, comprising:

means for determining missing edges in the sequence of data-signal edges;

means for inserting new data-signal edges into the sequence of data-signal edges to obtain a completed sequence of data-signal edges; and, means for recovering the clock signal from the completed sequence of data-signal edges, wherein the means for determining missing edges in the sequence of data-signal edges further comprises means for predicting a next clock signal, upon which said determination is based, the means for recovering the clock signal from the completed sequence of data-signal edges do not contain the means for determining missing edges and the means for inserting new data-signal edges, and the means for predicting the next clock signal is coupled to the means for recovering the clock signal, the means for determining missing edges and the means for inserting new data signal-edges.

* * * * *